(12) United States Patent
Hamada et al.

(10) Patent No.: US 10,832,977 B2
(45) Date of Patent: *Nov. 10, 2020

(54) DISPLAY ELEMENT MANUFACTURING METHOD AND MANUFACTURING APPARATUS

(71) Applicant: NIKON CORPORATION, Tokyo (JP)

(72) Inventors: Tomohide Hamada, Yokohama (JP); Kei Nara, Yokohama (JP)

(73) Assignee: Nikon Corporation, Tokyo (JP)

( * ) Notice: Subject to any disclaimer, the term of this patent is extended or adjusted under 35 U.S.C. 154(b) by 294 days.

This patent is subject to a terminal disclaimer.

(21) Appl. No.: 15/870,732

(22) Filed: Jan. 12, 2018

(65) Prior Publication Data

US 2018/0158740 A1 Jun. 7, 2018

Related U.S. Application Data

(60) Division of application No. 14/736,567, filed on Jun. 11, 2015, now Pat. No. 9,917,023, which is a division (Continued)

(30) Foreign Application Priority Data

Jun. 26, 2008 (JP) ............................. P2008-167270

(51) Int. Cl.
*H01L 21/66* (2006.01)
*G02F 1/13* (2006.01)
(Continued)

(52) U.S. Cl.
CPC ............ *H01L 22/20* (2013.01); *G02F 1/1303* (2013.01); *G02F 1/1333* (2013.01);
(Continued)

(58) Field of Classification Search
CPC ..... G02F 1/1303; G02F 1/1333; H01L 51/56; H01L 22/20; H01L 27/3244; H01L 2251/5338; H01L 2227/323
See application file for complete search history.

(56) References Cited

U.S. PATENT DOCUMENTS 6,118,132 A 9/2000 Tullis
6,547,616 B1 4/2003 Furukawa et al.
(Continued)

FOREIGN PATENT DOCUMENTS

JP 5-307173 11/1993
JP 2000/97628 4/2000
(Continued)

OTHER PUBLICATIONS

Non-Final Rejection dated Aug. 11, 2014, in prior U.S. Appl. No. 12/978,976.
(Continued)

*Primary Examiner* — Yoshihisa Ishizuka
(74) *Attorney, Agent, or Firm* — Finnegan, Henderson, Farabow, Garrett & Dunner, L.L.P.

(57) ABSTRACT

The display element manufacturing apparatus has a transporting part, which transports a substrate in a first direction, a first alignment system, which detects fiducial marks, a second alignment system, which is arranged at a prescribed distance from the first alignment system in the first direction and detects fiducial marks, calculating parts, which detect the fiducial marks and calculate the expansion/contraction of the substrate in the first direction or the transport speed of the substrate, and a processing part, which processes a prescribed position of the substrate based on at least one of the expansion/contraction of the substrate in the first direction or the transport speed of the substrate and the fiducial marks.

5 Claims, 10 Drawing Sheets

Related U.S. Application Data of application No. 12/978,976, filed on Dec. 27, 2010, now Pat. No. 9,086,585, which is a continuation of application No. PCT/JP2009/002748, filed on Jun. 17, 2009.

(51) Int. Cl.
*H01L 51/56* (2006.01)
*G02F 1/1333* (2006.01)
*H01L 27/32* (2006.01)

(52) U.S. Cl.
CPC .......... *H01L 27/3244* (2013.01); *H01L 51/56* (2013.01); *H01L 2227/323* (2013.01); *H01L 2251/5338* (2013.01)

(56) References Cited

U.S. PATENT DOCUMENTS

| | | | |
|---|---|---|---|
| 9,086,585 | B2 | 7/2015 | Hamada et al. |
| 2003/0113724 | A1 | 6/2003 | Schembri et al. |
| 2004/0002016 | A1* | 1/2004 | Rivers ................. H01L 51/0013 430/200 |
| 2005/0008778 | A1 | 1/2005 | Utsugi et al. |
| 2008/0171422 | A1 | 7/2008 | Tokie et al. |
| 2008/0254704 | A1 | 10/2008 | Hamada et al. |
| 2009/0039772 | A1 | 2/2009 | Takashima et al. |

FOREIGN PATENT DOCUMENTS

| | | |
|---|---|---|
| JP | 2003-173870 | 6/2003 |
| JP | 2004-303559 | 10/2004 |
| JP | 2007-33537 | 2/2007 |
| JP | 2007-110048 | 4/2007 |
| JP | 2008-70857 | 3/2008 |
| TW | 200401242 A | 1/2004 |
| WO | WO 2007/004627 A1 | 1/2007 |
| WO | WO 2007/008992 A2 | 1/2007 |
| WO | WO 2008/129819 A1 | 10/2008 |

OTHER PUBLICATIONS

Non-Final Rejection dated Feb. 25, 2014, in prior U.S. Appl. No. 12/978,976.
Office Action issued by the Taiwan Intellectual Property Office in Taiwanese Patent Application No. 104127636, dated Apr. 8, 2016, and English translation thereof.
Official Action issued by Taiwan Intellectual Property Office dated Sep. 30, 2014 in the counterpart Taiwanese Application No. 098121114 and English translation thereof.
Written Opinion of the International Searching Authority in International Application No. PCT/JP2009/002748 dated Jul. 28, 2009.
International Search Report for International Application No. PCT/JP2009/002748 dated Jul. 28, 2009.
Non-Final Rejection dated Aug. 30, 2016, in prior U.S. Appl. No. 14/736,567.
Final Rejection dated Mar. 23, 2017, in prior U.S. Appl. No. 14/736,567.

\* cited by examiner

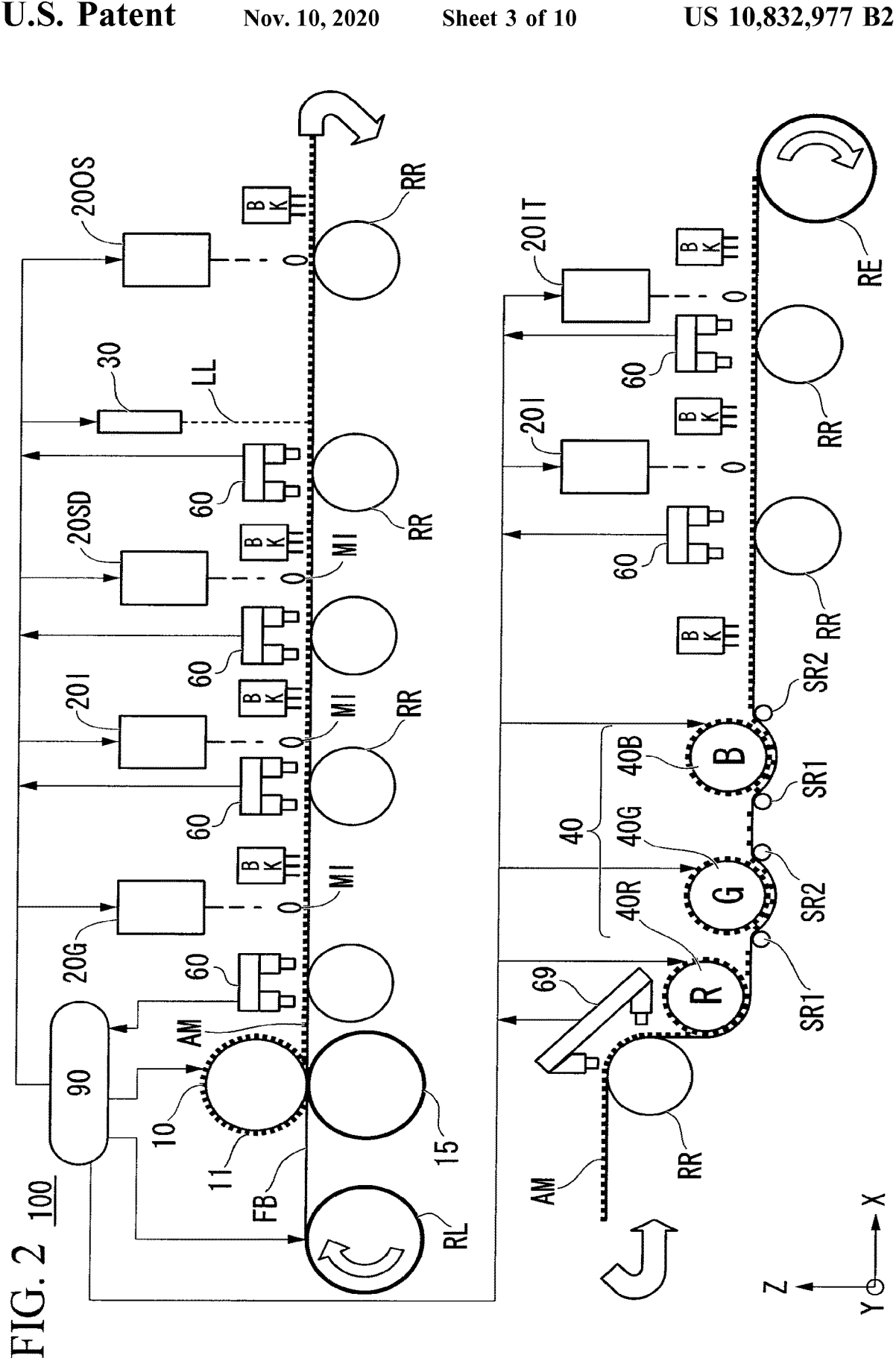

DISPLAY ELEMENT MANUFACTURING METHOD AND MANUFACTURING APPARATUS

CROSS-REFERENCE TO RELATED APPLICATIONS APPLICATION

This application is a division of U.S. patent application Ser. No. 14/736,567, filed on Jun. 11, 2015, which is a division of U.S. patent application Ser. No. 12/978,976, filed on Dec. 27, 2010, which is a Continuation Application of International Application No. PCT/JP2009/002748, filed on Jun. 17, 2009, which claims priority to Japanese Patent Application No. 2008-167270, filed on Jun. 26, 2008. The content of each of the above-referenced applications is expressly incorporated herein by reference in its entirety.

BACKGROUND

Field of the Invention

The present invention relates to a manufacturing method or a manufacturing apparatus of a display element such as an organic electroluminescence (EL) element, a liquid crystal display element or a field emission display (FED).

Description of the Related Art

Display elements such as organic EL and liquid crystal display elements have the special characteristics of being small, thin, low in power consumption and light in weight, so they are now widely used in various electronic devices. These display elements are becoming larger. Deformation of flexible sheet substrates in forming display elements on the now larger flexible sheet substrates that have been wound into a roll shape greatly affects product yield. For this reason, accurate acquisition of position information (alignment information) of the flexible sheet substrates in the manufacturing process greatly affects improvement of the product yield of liquid crystal display elements.

For example, Japanese Unexamined Patent Application Publication No. 2003-173870 discloses a manufacturing apparatus that manufactures an organic EL display element in a roll format as a measure for reduction of organic EL display elements and reduction of running costs. In this manufacturing device, in the case in which an organic EL element is formed on a substrate using a flexible sheet substrate, during alignment of the substrate and the mask, it is necessary to perform alignment of the flexible sheet substrate and the mask using an image recognition camera. Further, this manufacturing device has a first image recognition camera, which confirms the position of the flexible sheet substrate, and a second image recognition camera, which confirms the position of the mask.

However, there are cases in which the flexible sheet substrate contracts due to the heat in the respective processes. For forming a long display element, it is necessary to position the flexible sheet substrate under considering expansion and contraction thereof. In addition, because sliding occurs between the transport roller and the flexible sheet substrate or because there are differences in the rotation speed of the transport roller and the transport speed of the long flexible sheet substrate, it is necessary to appropriately ascertain the actual transport speed of the long flexible sheet substrate.

Aspects of the present invention provide a manufacturing apparatus for a display element that is able to form a display element with high accuracy.

SUMMARY

A display element manufacturing method according to an aspect of the present invention has an expansion and contraction calculating process, which detects fiducial marks on a substrate and calculates the expansion/contraction of the substrate in a prescribed direction using a first alignment system and a second alignment system arrayed in a prescribed direction, and a processing process that processes a prescribed position of the substrate by a processing apparatus based on the fiducial marks and the expansion/contraction of the substrate in a prescribed direction.

A display element manufacturing apparatus according to another aspect of the present invention has a transporting part, which transports a substrate that has fiducial marks in a prescribed direction, a first alignment system, which detects the fiducial marks, a second alignment system, which is arranged at a prescribed distance from the first alignment system in a prescribed direction and detects the fiducial marks, a calculating part, which detects the fiducial marks and calculates the expansion/contraction of the substrate in a prescribed direction or the transport speed of the substrate, and a processing part, which processes a prescribed position of the substrate based on at least one of the expansion/contraction of the substrate in a prescribed direction or the transport speed of the substrate and the fiducial marks.

According to aspects of the present invention, it is possible to provide a manufacturing apparatus for a display element that is able to form a display element with high accuracy.

BRIEF DESCRIPTION OF THE DRAWINGS

FIG. 2 is a schematic view that shows the configuration of a manufacturing apparatus that manufactures the organic EL element.

DESCRIPTION

<Organic EL Element of a Field Effect Transistor>

Figure 1A:
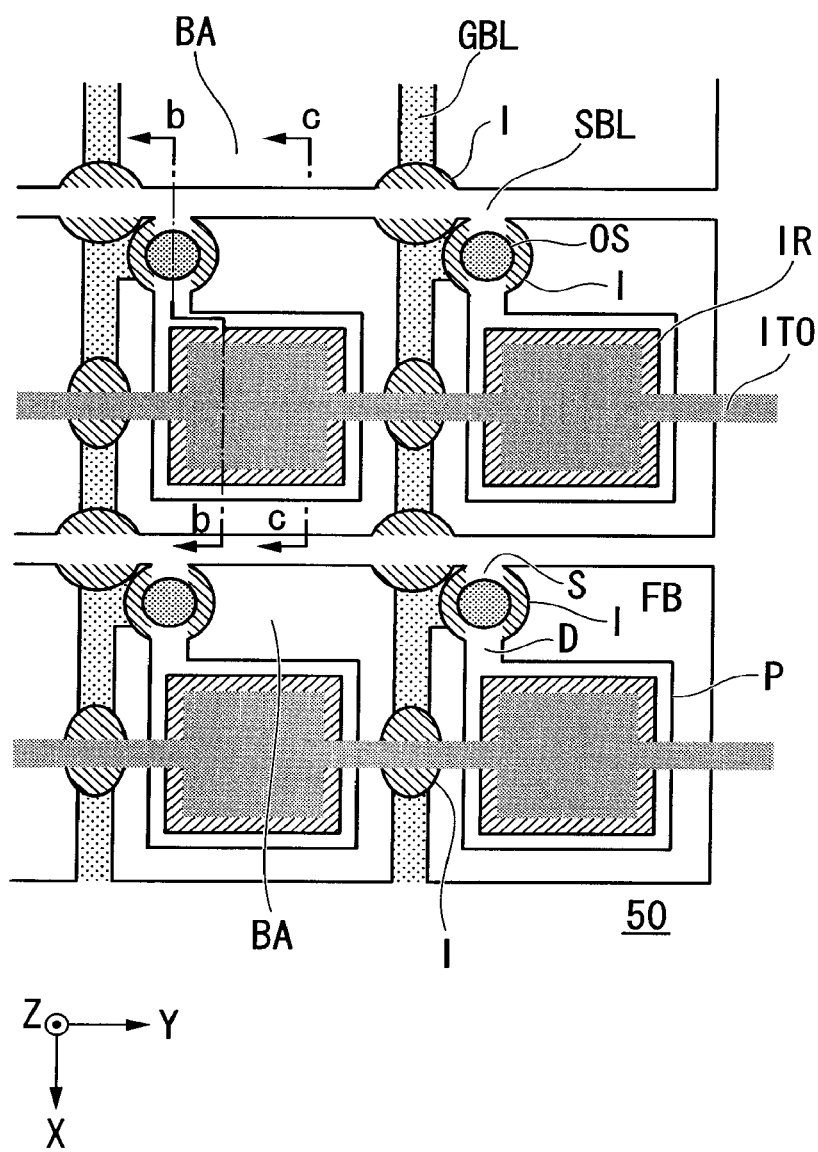
FIG. 1A is a top view of a bottom gate type organic EL element.
Figure 1B:
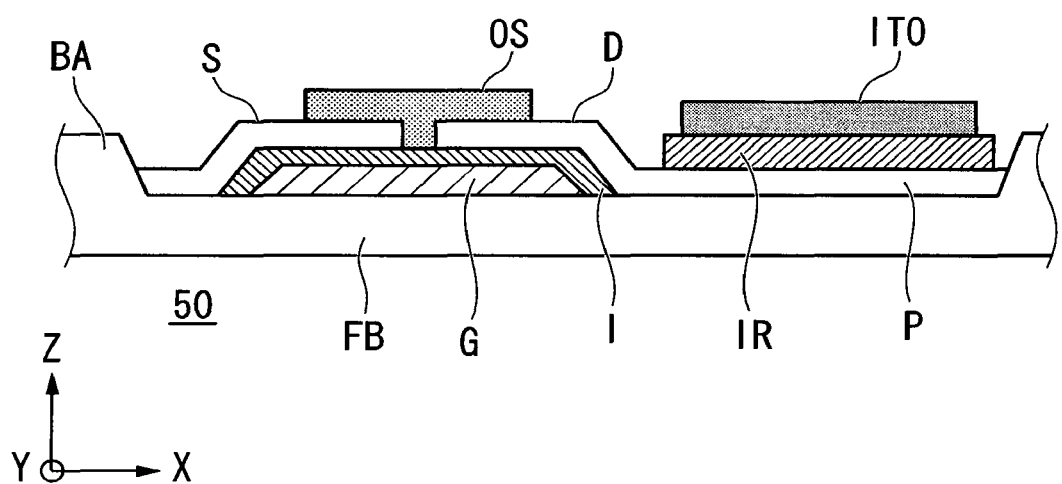
FIG. 1B is a b-b cross-sectional view of FIG. 1A.
Figure 1C:
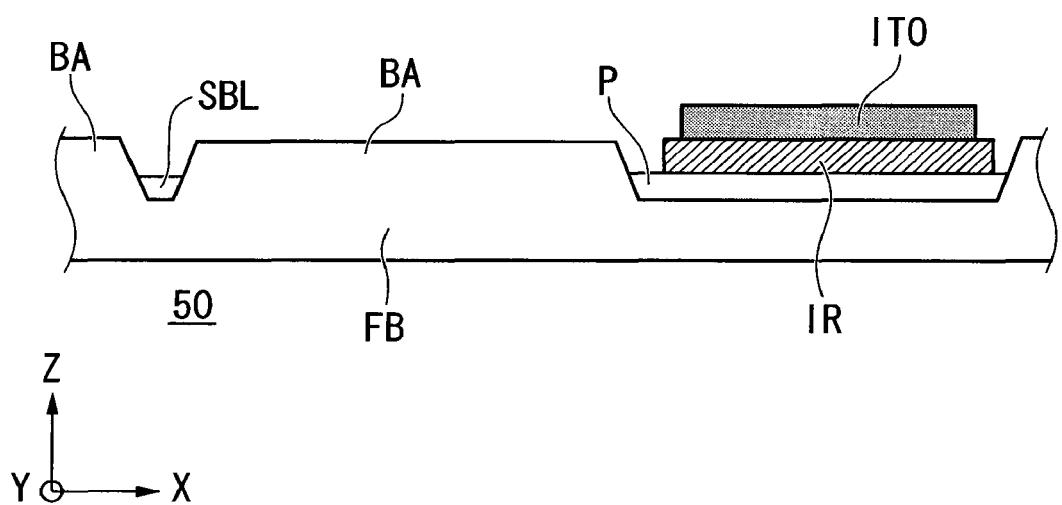
FIG. 1C is a c-c cross-sectional view of FIG. 1A.

FIG. 1A is an enlarged top view of an organic EL element 50, and FIG. 1B and FIG. 1C are a b-b cross-sectional view and a c-c cross-sectional view of FIG. 1A. The organic EL element 50 is a bottom contact type. The organic EL element 50 is such that a gate electrode C, a gate insulating layer I, a source electrode S, a drain electrode D, a pixel electrode P and an organic semiconductor layer OS are formed on a flexible sheet substrate FB (hereunder, referred to as sheet substrate FB).

As shown in FIG. 1B, the gate electrode G is formed on the sheet electrode FB. The insulating layer I is formed on that gate electrode G. On the insulating layer I, the source electrode S of a source bus line SBL is formed, and the drain electrode D, which is connected with the pixel electrode P, is also formed. The organic semiconductor layer OS is formed between the source electrode S and the drain electrode D. A field effect transistor is hereby completed. In addition, as shown in FIG. 1B and FIG. 1C, a light emitting layer IR is formed on the pixel electrode P, and a transparent electrode ITO is formed on that light emitting layer IR.

As is understood from FIG. 1B and FIG. 1C, partitions BA (bank layers) are formed on the sheet substrate FB. In addition, as shown in FIG. 1C, the source bus line SBL is formed between the partitions BA. In this way, due to the presence of the partitions BA, the source bus line SBL is formed with high accuracy while the pixel electrode P and the light emitting layer IR are also accurately formed. Note that, though not illustrated in FIG. 1B and FIG. 1C, a gate bus line GBL is also formed between the partitions BA similarly to the source bus line SBL. A manufacturing apparatus 100, which mass produces such an organic EL element 50, will be described below.

<Organic EL Element Manufacturing Apparatus>

FIG. 2 is a schematic view that shows the configuration of a manufacturing apparatus 100 that manufactures an organic EL element 50 that has the pixel electrode P and the light emitting layer IR, etc. shown in FIGS. 1A to 1C on a sheet substrate FB.

In manufacture of the organic EL element 50, a substrate on which a thin film transistor (TFT) and a pixel electrode have been formed is formed. In order to accurately form one or more organic compound layers (light emitting element layers) that include a light emitting layer on the pixel electrode on that substrate, it is preferable that partitions BA (see FIGS. 1A to 1C) be accurately formed at the boundary region of the pixel electrode.

The organic EL element manufacturing apparatus 100 comprises a partition forming process, an electrode forming process and a light emitting layer forming process. In the electrode forming process and the light emitting layer forming process, processing is performed precisely, so it is necessary to accurately obtain position information of the sheet substrate. For this reason, a first position detecting apparatus 60, which detects alignment marks AM, is required before the electrode forming process and the light emitting layer forming process, etc.

The organic EL element manufacturing apparatus 100 comprises a feed roll RL for sending out the sheet substrate FB, which has been wound into a roll shape. By means of the feed roll RL performing rotation at a prescribed speed, the sheet substrate FB is sent in the +X axis direction, which is the transport direction. In addition, the organic EL element manufacturing apparatus 100 comprises transport rollers RR (transporting parts) at a plurality of locations, and the sheet substrate FB is sent in the X axis directions also by means of these transport rollers RR rotating. The transport rollers RR may also be rubber rollers that interpose the sheet substrate FB from both sides. In addition, some of the transport rollers RR may be able to move in the Y axis directions, which intersect the transport direction.

<Partition Forming Process>

The sheet substrate FB that has been sent out from the feed roll RL first enters the partition forming process, which forms the partitions BA on the sheet substrate FB. In the partition forming process, an imprint roller 10 (a mark forming part) presses the sheet substrate FB while the sheet substrate FB is heated to at or above the glass transition point by a heat transfer roller 15 so that the pressed partitions BA maintain a shape. The roller surface of the imprint roller 10 is mirror finished, and a fine imprint mold 11 comprised of a material such as SiC or Ta is attached to that roller surface.

The fine imprint mold 11 forms a stamper for the wiring of the thin film transistor and a stamper for a color filter. A die shape that includes the partitions BA formed on the fine imprint mold 11 is transferred to the sheet substrate FB. In addition, in order to form alignment marks AM, which are fiducial marks, at both sides of the Y axis directions, which are the width directions of the sheet substrate FB, the fine imprint mold 11 has a stamper for alignment marks AM. The imprint roller 10 rotates, and the alignment marks AM and the partitions BA are formed.

<Electrode Forming Process>

For the thin film transistor (TFT), an inorganic semiconductor system or one that uses an organic semiconductor system may be used. If the thin film transistor is comprised using an organic semiconductor, a thin film transistor can be formed by employing the printing method or the droplet coating method.

The manufacturing apparatus 100 uses a droplet coating apparatus 20 (processing parts), which is one of the droplet coating methods, in the electrode forming process. The droplet coating apparatus 20 is able to employ an inkjet system or a dispenser system. Examples of an inkjet system are a charge control system, a pressure vibration system, an electromechanical conversion system, an electrothermal conversion system and an electrostatic absorption system. The droplet coating method has little waste in usage of materials and also can appropriately arrange the desired amount of material at the desired position. Note that the amount of one drop of metal ink MI coated according to the droplet coating method is, for example, 1~300 ng. Note that the metal ink is a liquid in which a conductor with a particle diameter of approximately 5 nm stably disperses in a solvent at room temperature, and carbon, silver (Ag) or gold (Au), etc. are used as conductors.

The manufacturing apparatus 100 arranges a first position detecting apparatus 60 after the process of the heat transfer roller 15. The first position detecting apparatus 60, by measuring the alignment marks AM, indicates correct coating positions to the gate droplet coating apparatus 20G of the next process. In particular, after the processing of the heat transfer roller 15, the sheet substrate FB tends to contract and deform, so the first position detecting apparatus 60 measures the amount of deformation of the sheet substrate FR The gate droplet coating apparatus 20G coats a metal ink into the partitions BA of the gate bus line GBL. Then, a heat treatment apparatus BK dries or bakes the metal ink by means of hot air or radiant heat such as far infrared rays. Through this processing, a gate electrode G (see FIG. 1B) is formed.

It is preferable that the first position detecting apparatus 60 detect the alignment marks AM in a status in which the sheet substrate FB and the transport rollers RR are in close contact so that there is no slackening of the sheet substrate FB. For this reason, the first position detecting apparatus 60 is arranged on the transport roller RR, and the first position detecting apparatus 60 detects the alignment marks AM in a status in which the sheet substrate FB is on the transport roller RR.

Next, the first position detecting apparatus 60 arranged downstream of the drying or baking process measures the alignment marks AM and indicates the correct coating position to the droplet coating apparatus 201 for the insulating layer of the next process. This is because the sheet substrate FB tends to contract and deform after the processing of the heat treatment apparatus BK. The droplet coating apparatus 201 for the insulating layer coats electrically resistive ink of a polyimide resin or a urethane resin to a switching part. Then, the heat treatment apparatus BK dries and hardens the electrically resistive ink by means of hot air or radiant heat such as far infrared rays. The gate insulating layer I is formed by these processes.

Next, the first position detecting apparatus 60 that is arranged after the process of the gate insulating layer I measures the alignment marks AM and reports the correct coating position to a droplet coating apparatus 20SD for the source, for the drain and for the pixel electrode of the next process. The droplet coating apparatus 20SD for the source, for the drain and for the pixel electrode coats the metal ink within the partitions BA of the source bus line SBL (see FIG. 1A) and within the partitions BA of the pixel electrode P. Then, the heat treatment apparatus BK dries or bakes the metal ink. An electrode in a status in which the source electrode S, the drain electrode D and the pixel electrode P (see FIG. 1A) are connected is formed by these processes.

Next, the first position detecting apparatus 60 that is arranged after the source electrode S and drain electrode D process measures the alignment marks AM and reports the cutting position of a cutting apparatus 30 and reports the correct coating position to the organic semiconductor droplet coating apparatus 20OS. The cutting apparatus 30 cuts the mutually connected source electrode S and drain electrode D. The cutting apparatus 30 is, for example, a femtosecond laser irradiating part that uses a femtosecond laser. The femtosecond laser irradiating part irradiates laser light LL with a wavelength of 760 nm at a pulse from 10 kHz to 40 kHz. The irradiation position of a laser light LL changes due to a rotation of a Galvano mirror (not shown) arranged in the optical path of the laser light LL.

The cutting apparatus 30 uses, for example, a femtosecond laser irradiating part, so processing on the sub micron order is possible. The cutting apparatus 30 accurately cuts the channel length (gap) between the source electrode S and the drain electrode D (see FIG. 1B), which determines the field effect transistor performance. The channel length of the source electrode S and the drain electrode D is approximately from 20 to 30 μm. An electrode, in which the source electrode S and the drain electrode D have been separated, is formed by means of this cutting processing.

For the cutting apparatus 30, in addition to a femtosecond laser, it is possible to use a carbon dioxide gas laser or a green laser, etc. In addition, for the cutting apparatus 30, in addition to a laser, a mechanical cutting apparatus may also be used, such as a dicing saw, etc.

Next, the organic semiconductor droplet coating apparatus 20OS coats the organic semiconductor ink to the switching part between the source electrode S and the drain electrode D. Then, the heat treatment apparatus BK dries or bakes the organic semiconductor ink by means of hot air or radiant heat such as far infrared rays. The organic semiconductor layer OS (see FIG. 1B) is formed by these processes.

Note that the compound that forms the organic semiconductor ink may be a monocrystalline material or an amorphous material and may also be low molecular or high molecular. Particularly desirable examples are monocrystals or π conjugate macromolecules of condensed ring aromatic hydrocarbons compounds, of which pentacene, triphenylene and anthracene are representative.

By doing the above, the manufacturing apparatus 100 employs the printing method or the droplet coating method to form a thin film transistor, etc. In addition, the channel length of the source electrode S and the drain electrode D (see FIG. 1B), which determines the performance of the thin film transistor, is formed by laser processing or mechanical processing by detecting the correct position using the first position detecting apparatus 60.

The sheet substrate FB, on which a thin film transistor and a pixel electrode have been formed, is such that the following light emitting layer forming process is performed continuing as shown in the lower stage of FIG. 2.

<Light Emitting Layer Forming Process>

The organic EL element manufacturing apparatus 100 continues to perform the process of forming the light emitting layer IR (see FIGS. 1A to 1C) of the organic EL element 50 on the pixel electrode P. The manufacturing apparatus 100, in the light emitting layer forming process, uses a printing roller 40. The printing roller 40, into which a phosphorescent compound has been soaked, rotates, and a layer of the phosphorescent compound EL is formed on the pixel electrode PX [sic]. The phosphorescent compound EL may also be coated using the droplet coating method rather than the printing method.

The second position detecting apparatus 69 that is arranged after the cutting apparatus 30 process reports the correct coating position to the printing roller 40 of the next process. The printing roller 40R for the red light emitting layer is arranged further to the lower side (Z directions) than the transport roller RR that changes the transport direction. For this reason, the sheet substrate FB is fed with the transport direction going from the +X axis direction to the −Z axis direction, and, by means of the printing roller 40R for the red light emitting layer, the sheet substrate FB is fed with the transport direction going from the −Z axis direction to the +X axis direction. Therefore, the contact area of the sheet substrate FB and the printing roller 40R for the red light emitting layer is increased.

The printing roller 40G for the green light emitting layer and the printing roller 40B for the blue light emitting layer comprise a small front part roller SR1 and rear part roller SR2 for pressing the sheet substrate FB. The front part roller SR1 and the rear part roller SR2 increase the region in which the sheet substrate FB follows the outer circumference surface of printing roller 40G and printing roller 40B, that is, the contact area.

The printing roller 40R for the red light emitting layer coats an R solution onto the pixel electrode P and performs film formation so that the thickness after drying becomes 100 nm. The R solution is a solution resulting from having dissolved a red dopant material in 1, 2-dichloroethane in a host material of polyvinyl carbazole (PVK).

Continuing, the printing roller 40G for the green light emitting layer coats a G solution onto the pixel electrode P.

The G solution is a solution resulting from having dissolved a green dopant material in 1, 2-dichloroethane in a host material PVK.

In addition, the printing roller 40B for the blue light emitting layer coats a B solution onto the pixel electrode P. The B solution is a solution resulting from having dissolved a blue dopant material in 1, 2-dichloroethane in a host material PVK. After that, the heat treatment apparatus BK dries and hardens the light emitting layer solution by means of hot air or radiant heat such as far infrared rays.

Next, the first position detecting apparatus 60 that is arranged after the light emitting layer printing process measures the alignment marks AM and reports the correct coating position to the droplet coating apparatus 20I for the insulating layer of the next process. The droplet coating apparatus 20I for the insulating layer coats an electrically resistive ink of a polyimide resin or a urethane resin to a part of the gate bus line GBL or the source bus line SBL so that a short does not occur with the transparent electrode ITO to be discussed later. Then, the heat treatment apparatus BK dries and hardens the electrically resistive ink by means of hot air or radiant heat such as far infrared rays.

After that, the first position detecting apparatus 60 that is arranged after the insulating layer forming process measures the alignment marks AM and reports the correct coating position to the droplet coating apparatus 20IT for the ITO electrode of the next process. The droplet coating apparatus 20IT for the ITO electrode coats an ITO (indium tin oxide) ink onto the red, green and blue light emitting layers. It is preferable that the ITO ink have a transmittance of 90% or higher. Then, the heat treatment apparatus BK dries and hardens the ITO ink by means of hot air or radiant heat such as far infrared rays.

When the light emitting layer and the ITO electrode are formed, the organic EL element 50 shown in FIGS. 1A to 1C is completed. Note that the organic EL element 50 is such that there are cases in which a positive hole transport layer and an electron transport layer are provided, but the printing method and the droplet coating method may be utilized for these layers as well.

The manufacturing apparatus 100 has the speed and alignment control part 90 shown in FIGS. 1A to 1C. The speed and alignment control part 90 performs speed control of the supply roll RL and the transport rollers RR. In addition, some of the transport rollers RR are able to move in the Y axis directions, and the speed and alignment control part 90 performs movement control of the transport rollers RR in the Y axis directions. In addition, the speed and alignment control part 90 receives the results of detection of the alignment marks AM from the plurality of alignment systems 60 and controls the position of coating of ink by the droplet coating apparatus 20, the coating position and timing of printing of the ink by the printing roller 40, and the cutting position and timing of the cutting apparatus 30.

In the present embodiment, the sheet substrate FB is a heat resistant resin film, and, specifically, it is possible to use one that is a polyethylene resin, a polypropylene resin, a polyester resin, an ethylene vinyl copolymer resin, a polyvinyl chloride resin, a cellulose resin, a polyamide resin, a polyimide resin, a polycarbonate resin, a polystyrene resin or a vinyl acetate resin and that has a light transmission function.

The sheet substrate FB receives the heat treatment of heat transfer in the partition forming process and receives heat treatment by the heat treatment apparatus BK, so the sheet substrate FB is heated to approximately 200° C. The sheet substrate FB is such that an inorganic filler may be mixed into the resin film to decrease the thermal expansion coefficient so that the dimensions change as little as possible even though heat is received.

<Alignment>

Figure 3:
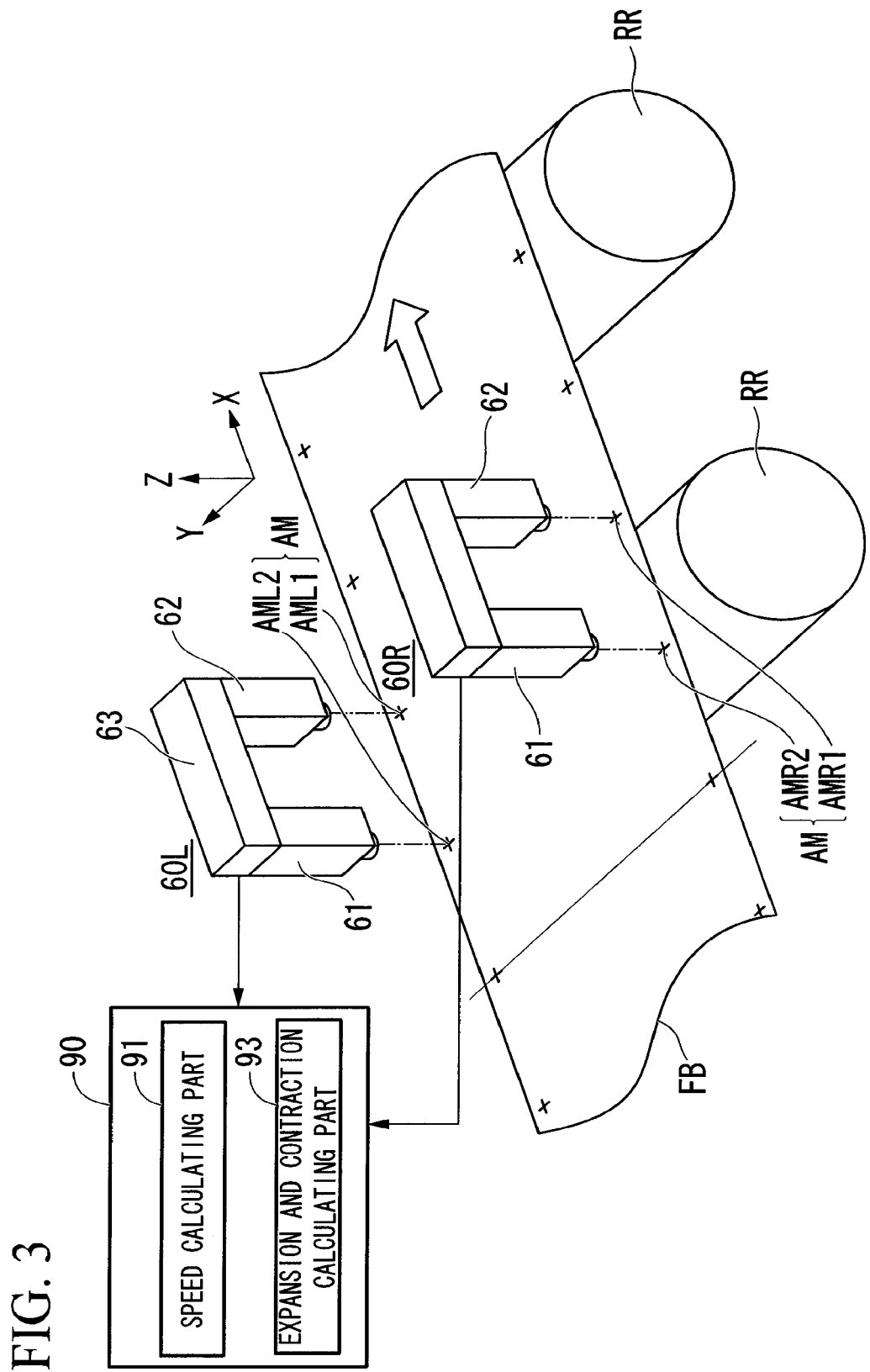
FIG. 3 is an oblique view of a first position detecting apparatus.

FIG. 3 is an oblique view of the first position detecting apparatus 60. The sheet substrate FB shown in FIG. 3 moves in the transport direction (+X axis direction). In FIG. 3, the alignment marks AM are formed at equivalent intervals in the X axis directions at the right side and the left side of the sheet substrate FB. Hereunder, the alignment marks AM below the right side first position detecting apparatus 60R will be referred to as alignment mark AMR1 and alignment mark AMR2. The alignment marks AM below the left side first position detecting apparatus 60L will be referred to as alignment mark AML1 and alignment mark AML2. In addition, when these cannot be particularly distinguished, all will be referred to as alignment marks AM.

The first position detecting apparatus 60 (60R, 60L) comprises a first alignment system 61 and a second alignment system 62 and is arranged so as to come to the upper part of the alignment marks AM of the sheet substrate FB. The first alignment system 61 and the second alignment system 62 are fixed by means of a holding part 63. The holding part 63 is arranged at a prescribed distance, and an invar alloy comprising low thermal expansion coefficient Fe-36Ni, a Kovar alloy comprising Fe29Ni-17Co or ceramics is used as the material of the holding part 63. For this reason, the distance between the first alignment system 61 and the second alignment system 62 is not affected by heat, and it is possible to maintain a prescribed distance. The first position detecting apparatus 60 is such that a right side first position detecting apparatus 60R and a left side first position detecting apparatus 60L are installed at the upper part of both sides of the sheet substrate FB, which is a position orthogonal to the transport direction (+X axis direction) of the sheet substrate FB as shown in FIG. 3.

The first alignment system 61 of the right side first position detecting apparatus 60R detects alignment mark AMR2 after having detected alignment mark AMR1. At that time, the second alignment mark 62 detects alignment mark AMR1. At a similar timing, the first alignment system 61 of the left side first position detecting apparatus 60L detects alignment mark AML2, and the second alignment system 62 detects alignment mark AML1.

The right side first position detecting apparatus 60R detects alignment mark AMR1 using the first alignment system 61 and detects the moving alignment mark AMR1 using the second alignment system 62. The detection signals are sent to a speed calculating part 91 within the speed and alignment control part 90. The interval between the first alignment system 61 and the second alignment system 62 is accurate, so it is possible to measure an accurate right side speed of the sheet substrate FB. Similarly, the left side first position detecting apparatus 60L detects alignment mark AML1 using the first alignment system 61 and detects the moving alignment mark AML1 using the second alignment system 62. Those detection signals are sent to the speed calculating part 91 within the speed and alignment control part 90. The interval between the first alignment system 61 and the second alignment system 62 is accurate, so it is possible to measure an accurate left side speed of the sheet substrate FB.

In addition, by means of the right side first position detecting apparatus 60R and the left side first position detecting apparatus 60 simultaneously measuring alignment mark AMR1 and alignment mark AML1 of both sides of the sheet substrate FB, the speed calculating part 91 is able to measure left-right travel misalignment of the sheet substrate FB.

In addition, the first alignment system 61 and the second alignment system 62 are able to simultaneously measure alignment mark AMR1 and alignment mark AMR2 of the sheet substrate FB, so it is possible to measure the distance between alignment mark AMR1 and alignment mark AMR2. An elongation and contraction calculating part 93 within the speed and alignment control part 90 compares the detected distance between alignment mark AMR1 and alignment mark AMR2 with the design value distance between alignment mark AMR1 and alignment mark AMR2. Then, the elongation and contraction calculating part 93 calculates the right side elongation/contraction status of the sheet substrate FB. The design value distance between alignment mark AMR1 and alignment mark AMR2 matches that between the pair of alignment marks AM formed by the fine imprint mold 11 (see FIG. 2).

In addition, similarly, by simultaneously measuring alignment mark AML1 and alignment mark AML2 of the left side of the sheet substrate FB, the elongation and contraction calculating part 93 is able to measure the elongation/contraction status of the region surrounded by alignment mark AMR1, alignment mark AMR2, alignment mark AML1 and alignment mark AML2.

Figure 4:
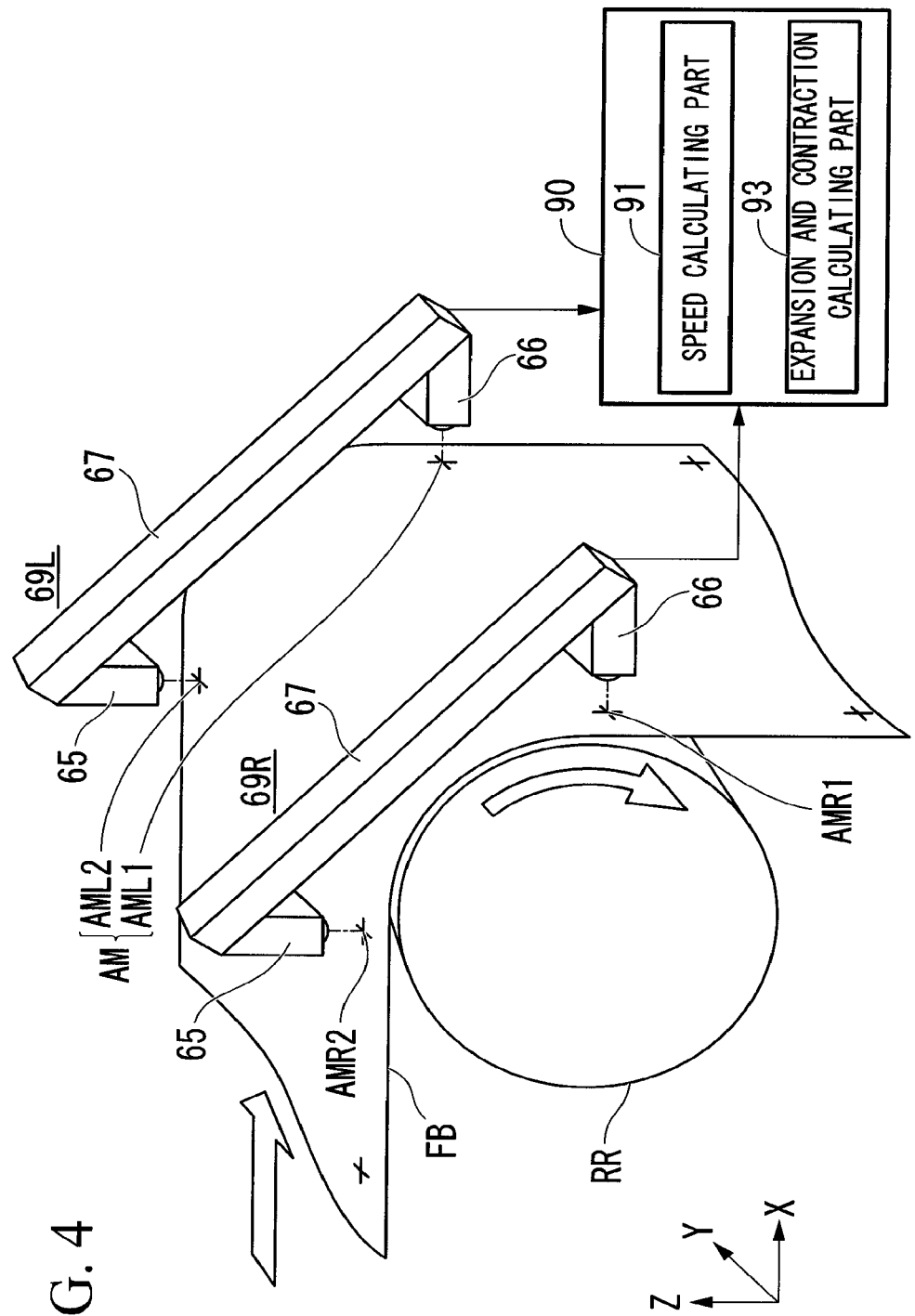
FIG. 4 is an oblique view of a second position detecting apparatus.

FIG. 4 is an oblique view of the second position detecting apparatus 69. The second position detecting apparatus 69 has a configuration similar to that of the first position detecting apparatus 60 and is comprised of a first alignment system 65, a second alignment system 66 and a holding part 67. However the attachment angle between the first alignment system 65 and the second alignment system 66 differs. They are respectively installed so that the point of intersection of the optical axis of the first alignment system 65 and the optical axis of the second alignment system 66 becomes 90°. The material of the holding part 67 of the second position detecting apparatus 69 is formed by a low thermal expansion coefficient material, similarly to the first position detecting apparatus 60.

With respect to the transport direction of the sheet substrate shown in FIG. 4, the first alignment system 65 of the right side second position detecting apparatus 69R of the right side detects alignment mark AMR2 after the sheet substrate FB has moved in the transport direction and alignment mark AMR1 has been detected. At that time, the second alignment system 66 is in a status in which it is detecting alignment mark AMR1. At a similar timing, the left side second position detecting apparatus 69L also detects alignment mark AML1 using the second alignment system 66 when the first alignment system 65 has detected alignment mark AML2.

There are a sheet substrate FB and a transport roller RR on the optical axis of the first alignment system 65 of the second position detecting apparatus 69 (69R, 69L). The first alignment system 65 is able to detect the alignment marks AM in a status in which the sheet substrate FB and the transport roller RR are in close contact, so it is possible to measure while eliminating slackening of the sheet substrate FB. The second alignment system 66 of the second position detecting apparatus 69 (69R, 69L) is also similarly able to detect the alignment marks AM in a status in which the sheet substrate FB and the transport roller RR are in close contact. Specifically, from the visual field of the first alignment system 65 to the visual field of the second alignment system 66 of the second position detecting apparatus 69 is all in close contact with the surface of the transport roller RR, so it is possible to accurately perform measurement in the range surrounded by the alignment marks AM of four locations of the sheet substrate FB, from which slackening has been eliminated.

By simultaneously measuring alignment mark AMR1, alignment mark AMR2, alignment mark AML1 and alignment mark AML2 by means of the second position detecting apparatus 69 (69R, 69L), the speed calculating part 91 is able to simultaneously calculate the speed and left-right travel misalignment similarly to the first position detecting apparatus 60. In addition, the elongation and contraction calculating part 93 is able to calculate the elongation/contraction status of the region surrounded by the alignment marks AM of four locations (alignment mark AMR1, alignment mark AMR2, alignment mark AML1 and alignment mark AML2).

The first position detecting apparatus 60 or the second position detecting apparatus 69 of the present embodiment may perform imaging by CCD or CMOS under visible light illumination and may process that picked up image to detect the positions of the alignment marks AM. In addition, the first position detecting apparatus 60 or the second position detecting apparatus 69 may also be of a method in which laser light is irradiated to the alignment marks AM to detect the positions of the alignment marks AM by receiving the scattered light thereof.

<Calibration of the Distance Between the First Alignment System and the Second Alignment System>

Figure 5:
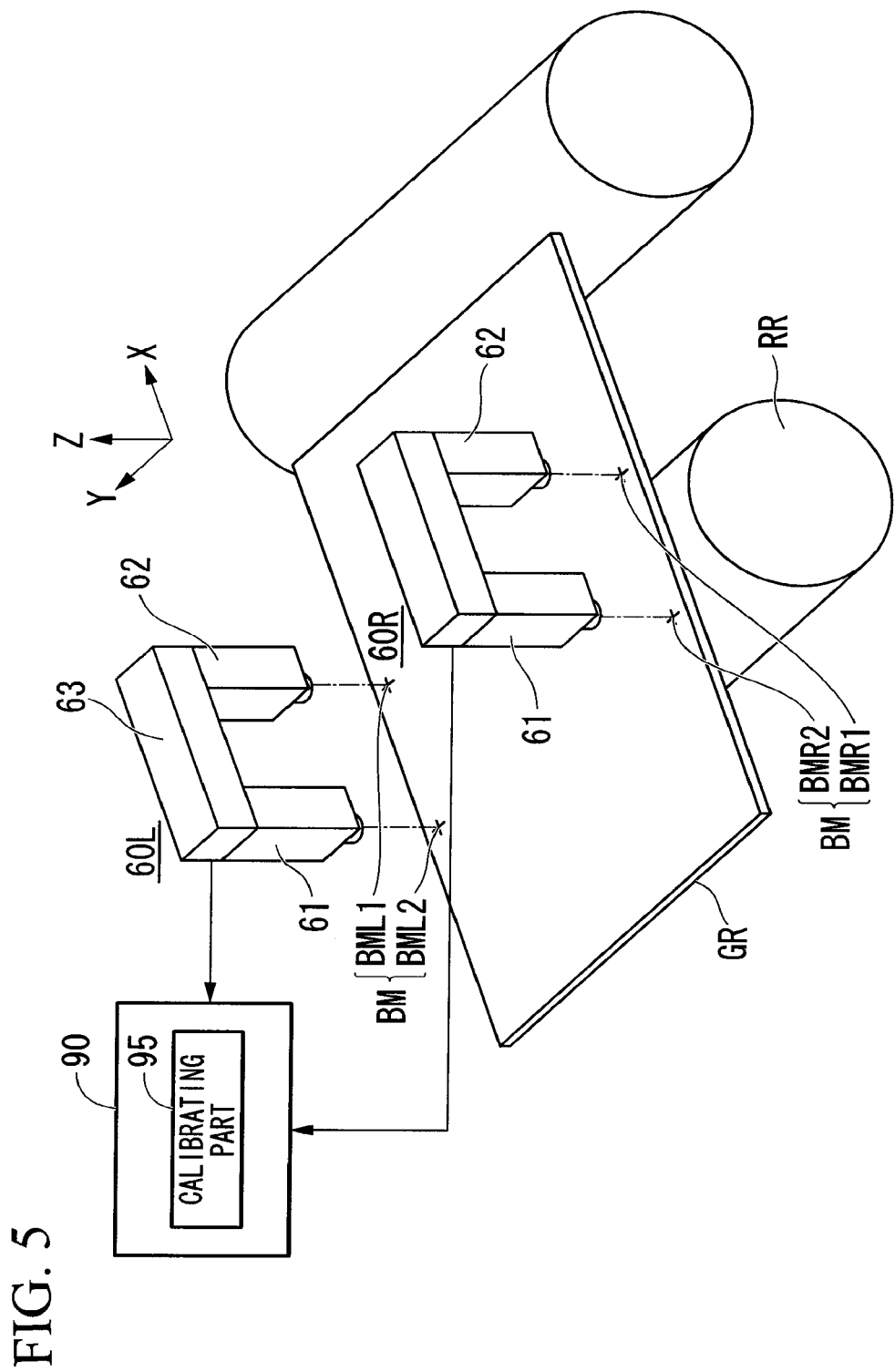
FIG. 5 is a drawing that calibrates the distance between the first alignment system and the second alignment system in the first position detecting apparatus.

FIG. 5 is a drawing that shows calibration of the distance between the first alignment system 61 and the second alignment system 62 of the first position detecting apparatus 60.

The first alignment system 61 and the second alignment system 62 are fixed by a holding part 63 comprised of a material with a low thermal expansion coefficient, but the distance between the first alignment system 61 and the second alignment system 62 fluctuates due to the effects of temperature, etc. Therefore, the organic EL element manufacturing apparatus 100 causes a calibration substrate GR in which base marks BM for calibration have been accurately formed to pass through prior to the sheet substrate FB being processed. Then, calibration of the distance between the first alignment system 61 and the second alignment system 62 is performed.

The calibration substrate GR is a glass or plastic substrate with little thermal expansion, and base mark BMR1, base mark BMR2, base mark BML1 and base mark BML2 are formed on that substrate. In addition, the positions of these base marks BM are accurately measured in advance by means of a measuring unit that is not shown. Specifically, the distance between base mark BMR1 and base mark BMR2, the distance between base mark BML1 and base mark BML2, the distance between base mark BMR1 and base mark BML1, and the distance between base mark BMR2 and base mark BML2 are measured in advance.

The manufacturing apparatus 100 transports the calibration substrate GR instead of the sheet substrate FB. The calibration substrate GR stops in the vicinity of the first position detecting apparatus 60. The first alignment system 61 and the second alignment system 62 of the first position detecting apparatus 60 detect the base marks BM. Based on those detection results, a calibrating part 95 within the speed and alignment control part 90 calibrates the distance between the first alignment system 61 and the second alignment system 62. In addition, the calibrating part 95 is also able to calibrate the distance between the right side first position detecting apparatus 60R and the left side first position detecting apparatus 60L.

As shown in FIG. 2, the first position detecting apparatus 60 is arranged at a plurality of locations. The distances between the first alignment system 61 and the second alignment system 62 are calibrated for the respective first position detecting apparatuses 60.

Note that, though not shown, the distance between the first alignment system 65 and the second alignment system 66 of the second position detecting apparatus 69 is calibrated using a flexible calibration substrate that has little thermal expansion. Base marks BM for calibration are drawn on the flexible calibration substrate as well. The calibrating part 95 is able to calibrate the distance between the optical axes of the first alignment system 65 and the second alignment system 66 of the second position detecting apparatus 69.

<Ordinary Measurement of the Distance Between the First Alignment System and the Second Alignment System>

Figure 6A:
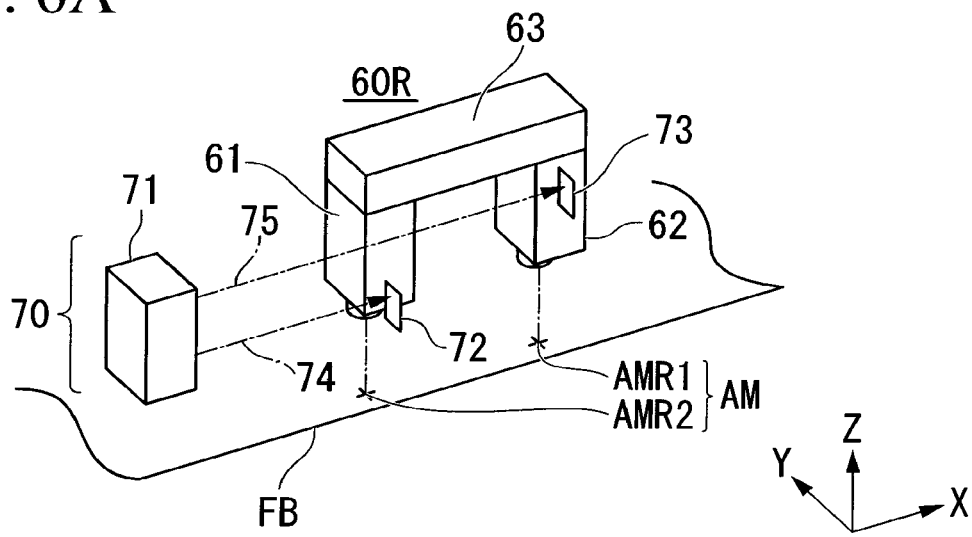
FIG. 6A is an oblique view of a laser interferometer of the right side first position detecting apparatus.
Figure 6B:
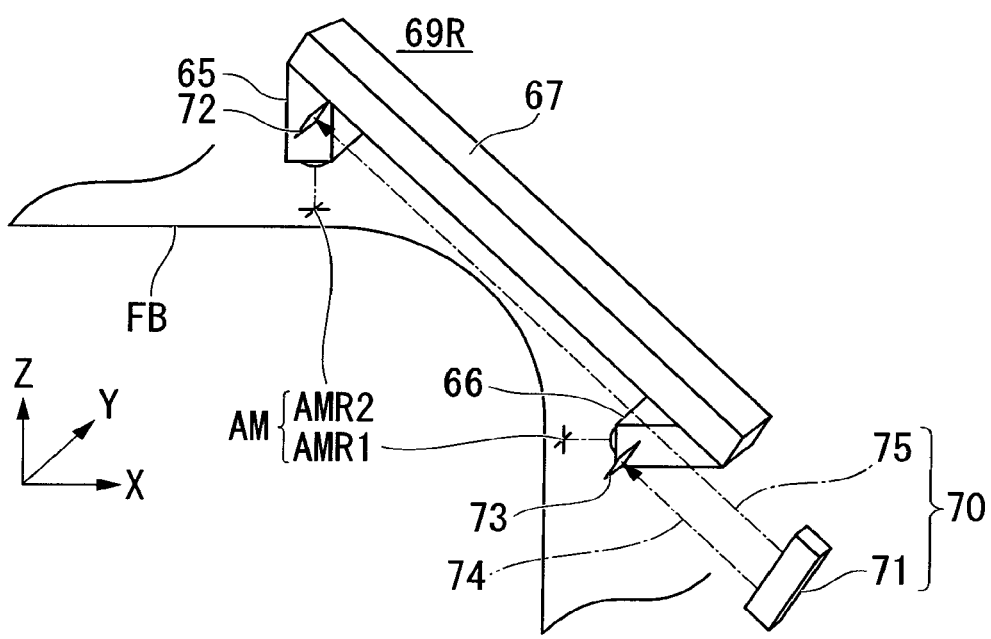
FIG. 6B is an oblique view of a laser interferometer of the right side second position detecting apparatus.

FIG. 6A is an oblique view that shows a laser interferometer 70 of the right side first position detecting apparatus 60R of the first position detecting apparatus 60, and FIG. 6B is an oblique view that shows a laser interferometer 70 of the right side second position detecting apparatus 69R of the second position detecting apparatus 69. Note that, since the laser interferometers 70 of the left side first position detecting apparatus 60L and the left side second position detecting apparatus 69L have a similar configuration, they are not shown.

As shown in FIG. 6A, the laser interferometer 70 is comprised of a laser interferometer main body 71, a fixed mirror 72 and a movable mirror 73. The distance between the first alignment system and the second alignment system is related to the elongation/contraction status of the holding part 63. For this reason, the fixed mirror 72 is installed on the first alignment system 61, and the movable mirror 73 is installed on the second alignment system 62 so that the lengthwise direction of the holding part 63 and the projection directions of a laser light 74 and a laser light 75 become parallel. The two laser lights 74, 75 that are projected from the laser interferometer main body 71 are projected in parallel along the lengthwise direction of the holding part 63 and are projected toward the fixed mirror 72 installed on the first alignment system 61 and the movable mirror 73 installed on the second alignment system 62.

In addition, the laser interferometer main body 71 synthesizes the laser light reflected by the fixed mirror 72 and the movable mirror 73 and measures the relative positional change between the first alignment system 61 and the second alignment system 62 based on the resulting interference pattern. The laser interferometer 70 is able to measure the relative positional change between the first alignment system 61 and the second alignment system 62 even in the midst of manufacturing of an organic EL element on a sheet substrate FB. Note that a laser light source (not shown) that projects from the laser interferometer main body 71 is at one location and is divided in two, into laser light 74 and laser light 75, by a spectroscope (not shown) such as beam splitter.

As shown in FIG. 6B, even for the second position detecting apparatus 69, a fixed mirror 72 is installed on the first alignment system 65, and a movable mirror 73 is installed on the second alignment system 66. In addition, the two laser lights 74, 75, which are projected from the laser interferometer main body 71, are projected in parallel along the lengthwise direction of a holding part 67 and measure the relative positional change between the first alignment system 65 and the second alignment system 66.

The organic EL element manufacturing apparatus 100 always accurately measures the distance between first alignment system 61 and second alignment system 62 or the distance between first alignment system 65 and second alignment system 66 by means of a laser interferometer 70. For this reason, it is possible to accurately calibrate the measurement values of the first position detecting apparatus 60 or the second position detecting apparatus 69. Therefore, the organic EL element manufacturing apparatus 100 is always able to obtain accurate measurement results.

<Processing Based on the Detection Results of the First Position Detecting Apparatus>

Figure 7A:
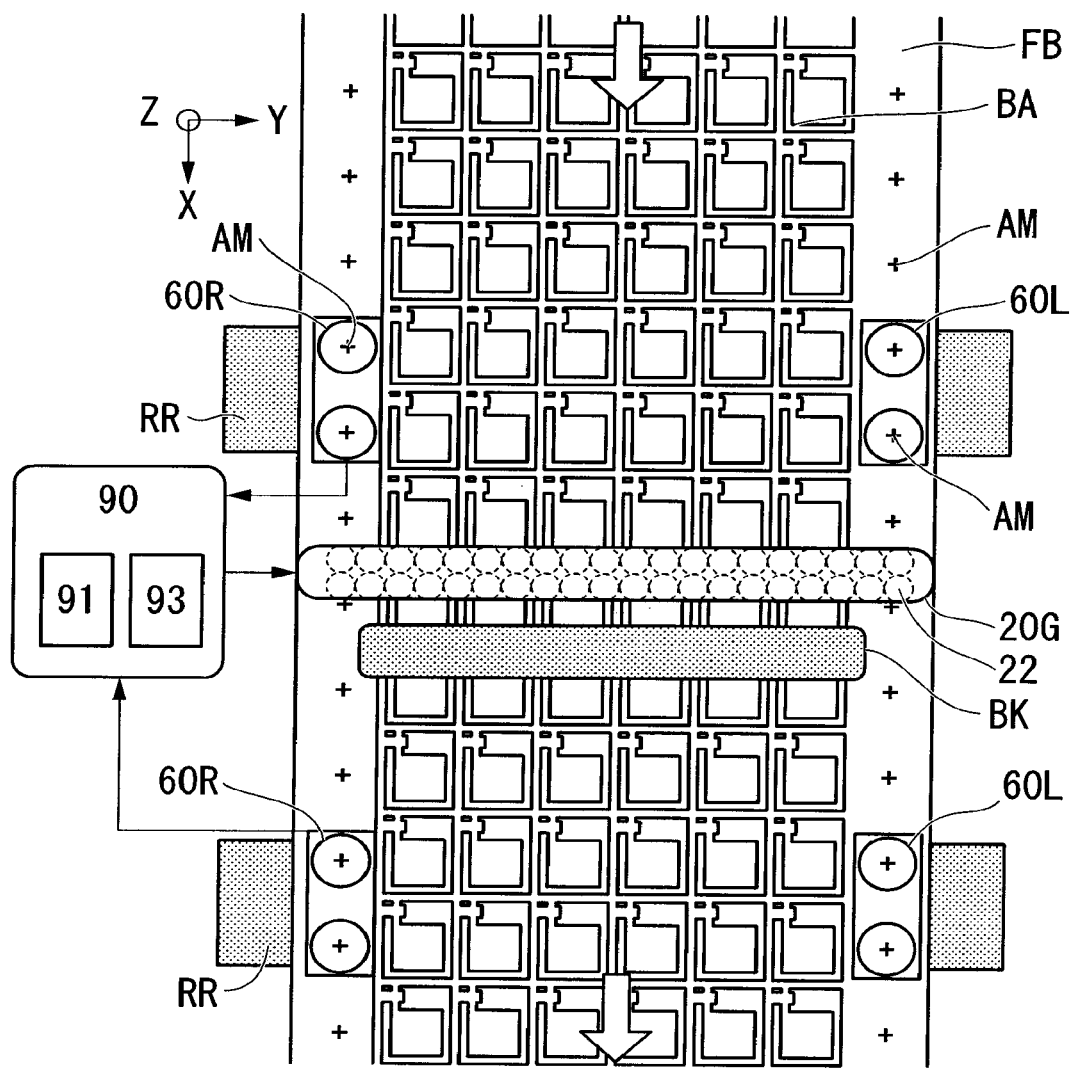
FIG. 7A is a top view of the first position detecting apparatus and the first position detecting apparatus and gate droplet coating apparatus.

FIG. 7A shows an upper surface view of the first position detecting apparatus 60 and the first position detecting apparatus 60 and gate droplet coating apparatus 20G. Hereunder, the gate droplet coating apparatus 20G will be described as a representative of processing apparatuses. A description of the second position detecting apparatus 69 will be omitted.

The speed calculating part 91 and the elongation and contraction calculating part 93 of the speed and alignment control part 90 measure the speed, left-right travel misalignment and elongation/contraction status of the sheet substrate FB by detecting the alignment marks AM (a total of four locations) of both sides formed on the sheet substrate FB using the first position detecting apparatus 60. In addition, the first position detecting apparatus 60 is provided above the transport roller RR, and it reduces as much as possible error resulting from slackening of the sheet substrate FB.

The speed and alignment control part 90 sends out signals relating to the speed, left-right travel misalignment and elongation/contraction status of the sheet substrate FB to the gate droplet coating apparatus 20G so that the gate droplet coating apparatus 20G is able to coat liquid droplets to the optimal position. In addition, the speed and alignment control part 90 similarly sends out sheet substrate FB speed and printing roller 40 rotational velocity instructions based on the detection results of the first position detecting apparatus 60.

The gate droplet coating apparatus 20 is arranged in the Y axis directions, a plurality of columns of nozzles 22 are arranged in the Y axis directions, and a plurality of rows of nozzles 22 are arranged in the X axis directions. The positional relationship of the plurality of nozzles 22 in the XY axis directions is stored in advance.

Figure 7B:
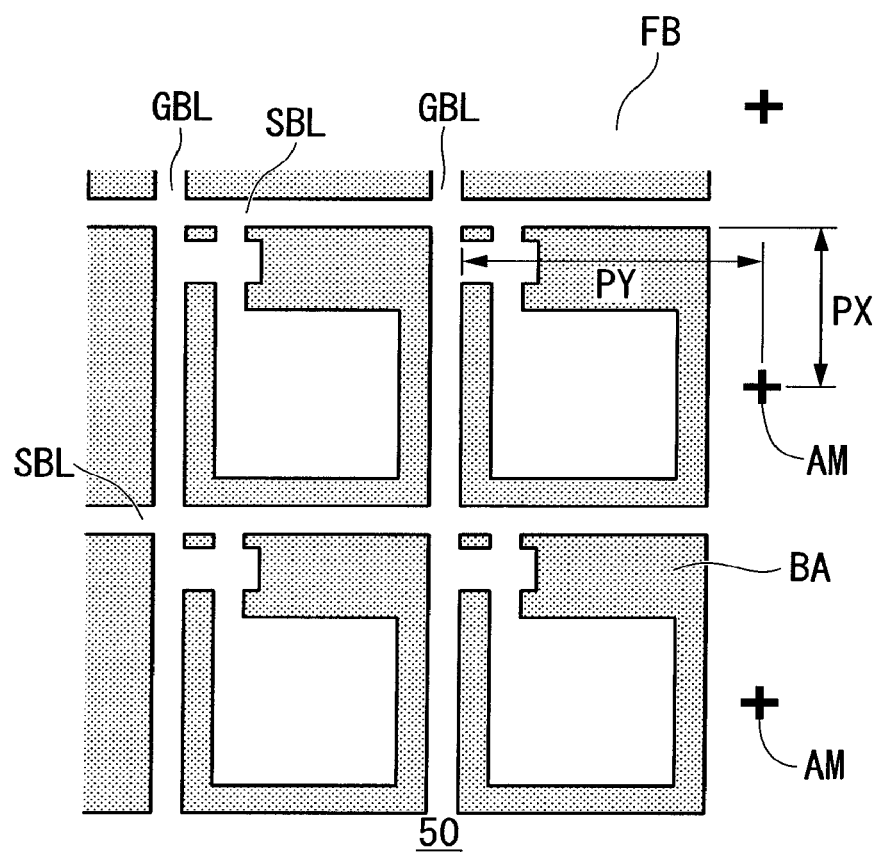
FIG. 7B is a drawing that shows the positional relationship between alignment marks and a gate bus line and a source bus line of a field effect transistor.

On the other hand, the positional relationship between the alignment marks AM, and the gate bus line GBL and the source bus line SBL of the field effect transistor are also defined in advance. Specifically, the die shapes of the alignment marks AM and the partitions BA formed by the fine imprint mold 11 shown in FIG. 2 are transferred to the sheet substrate FB. FIG. 7B shows a sheet substrate FB to which the die shapes have been transferred. As shown in FIG. 7B, a prescribed distance PY between the alignment mark AM and the gate bus line GBL is defined in the Y axis directions, and a prescribed distance PX between the alignment mark AM and the source bus line SBL is defined in the X axis directions.

Specifically, the positional relationship of the plurality of nozzles 22 and the positional relationship between the alignment marks AM and the gate bus line GBL are ascertained in advance. Therefore, the gate droplet coating apparatus 20G switches the timing of coating of the metal ink from the nozzles 22 as well as the nozzles 22 that coat the metal ink corresponding to the speed of the sheet substrate FB and the signals relating to left-right travel misalignment and elongation/contraction status that are sent from the speed and alignment control part 90.

Therefore, the droplet coating apparatus 20G is able to coat the metal ink from the correct nozzles 22 at an appropriate timing based on signals relating to the speed, left-right travel misalignment and elongation/contraction status of the sheet substrate FB.

Though not shown, the other droplet coating apparatus 20 is also similarly able to adjust the position at which the ink, etc. is to be coated to the sheet substrate FB by obtaining signals from the speed and alignment control part 90. In addition, the cutting apparatus 30 also similarly adjusts the cutting position by obtaining signals from the speed and alignment control part 90.

In FIG. 7B, one alignment mark AM is provided for one row of field effect transistor partitions BA in the X axis directions. However, a plurality of alignment marks AM may also be provided for one row of field effect transistor partitions BA. In addition, if there is space in the sheet substrate FB, an alignment mark AM may also be provided at the center region rather than just at the two sides of the sheet substrate FB. Note that the alignment marks AM are shown with examples of a cross shape, but they may also have another mark shape such as a circular mark or a diagonal straight line mark.

<Operation of the Organic EL Element Manufacturing Apparatus>

Figure 8:
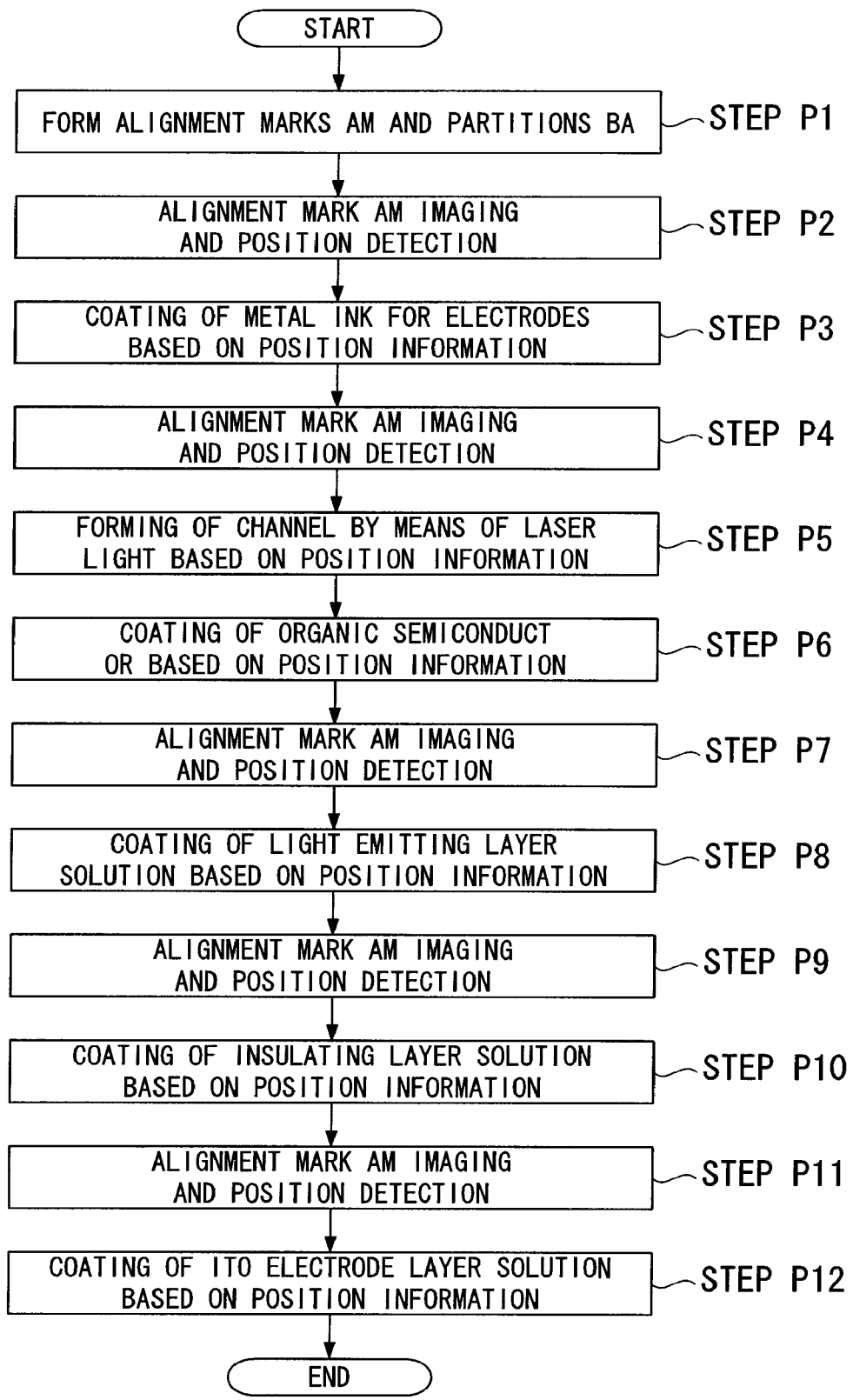
FIG. 8 is an abbreviated flow chart of the manufacturing process of the organic EL element.

FIG. 8 is an abbreviated flow chart of the manufacturing process of the organic EL element 50.

In step P1, the alignment marks AM and partitions BA such as those of the thin film transistor and the light emitting layer are formed on the sheet substrate FB by heat transfer by means of the imprint roller 10. Note that, the relative positional relationship between the alignment marks AM and the partitions BA is important, so it is preferable that they be formed simultaneously.

In step P2, by means of the alignment marks AM being imaged by the first position detecting apparatus 60, the speed calculating part 91 and the elongation and contraction calculating part 93 of the speed and alignment control part 90 calculate the speed, left-right travel misalignment and elongation/contraction status of the heat treated sheet substrate FB.

Next, in step P3, the gate droplet coating apparatus 20G; the insulating layer droplet coating apparatus 20I and the source and drain droplet coating apparatus 20SD sequentially coat metal inks, etc. for various electrodes based on signals relating to the speed, left-right travel misalignment and elongation/contraction status of the sheet substrate FB from the speed and alignment control part 90.

In step P4, the first position detecting apparatus 60 images the alignment marks AM, and the speed calculating part 91 and the elongation and contraction calculating part 93 calculate the speed, left-right travel misalignment and elongation/contraction status of the heat treated sheet substrate FB.

Next, in step P5, the laser light LL of the cutting apparatus 30 forms a channel that is the gap between the source electrode S and the drain electrode D based on signals from the speed and alignment control part 90.

In addition, in step P6, the organic semiconductor droplet coating apparatus 20OS forms an organic semiconductor in the gap between the source electrode S and the drain electrode D based on signals from the speed and alignment control part 90.

In step P7, the second position detecting apparatus 69 images the alignment marks AM, and the speed and alignment control part 90 calculates the speed, left-right travel misalignment and elongation/contraction status of the heat treated sheet substrate FB.

Next, in step P8, the printing roller 40 forms the RGB light emitting layers based on signals from the speed and alignment control part 90.

In step P9, the first position detecting apparatus 60 images the alignment marks AM, and the speed and alignment control part 90 calculates the speed, left-right travel misalignment and elongation/contraction status of the heat treated sheet substrate FB.

Next, in step P10, the insulating layer droplet coating apparatus 20I forms the insulating layer I based on signals from the speed and alignment control part 90.

In step P11, the first position detecting apparatus 60 images the alignment marks AM, and the speed and alignment control part 90 calculates the speed, left-right travel misalignment and elongation/contraction status of the heat treated sheet substrate FB.

Next, in step P12, the ITO electrode droplet coating apparatus 20IT forms the ITO electrode based on signals that the speed and alignment control part 90 has corrected.

In the above embodiments, the fine imprint mold 11 (FIG. 2) was premised upon alignment marks AM being formed on the sheet substrate FB. However, a sheet substrate FB on which alignment marks AM have been formed in advance may be purchased, and the fine imprint mold 11 may form only partitions BA on that sheet substrate FB. In this case, the positional relationship between the alignment marks AM and the partitions BA in the XY directions should be measured by a measuring apparatus that is not shown.

An organic EL element manufacturing method was described, but the manufacturing apparatus of the present invention can also be applied to a liquid crystal display element, a field emission display, etc.

In addition, a heat treatment apparatus BK was provided in the manufacturing apparatus of the above-mentioned embodiments, but inks or solutions that do not require heat treatment due to improvements in metal inks or light emitting layer solutions are being proposed. For this reason, it is not absolutely necessary to provide a heat treatment apparatus BK.

Through the manufacturing method of the above-mentioned embodiments, it is possible to ascertain the expansion/contraction of the substrate in a prescribed direction, and it is possible to process a substrate according to that expansion/contraction, so it is possible to accurately process the substrate even in the case in which the substrate has expanded/contracted due to heat, etc.

Through the manufacturing apparatus of the above-mentioned embodiments, it is possible to ascertain the expansion/contraction or the transport speed of the substrate in a prescribed direction, and it is possible to process the substrate according to that expansion/contraction or transport speed, so it is possible to accurately process the substrate.

According to the above-mentioned embodiments, with respect to substrates that tend to expand and contract, is able to measure the expansion/contraction or the transport speed of a substrate by detecting fiducial marks by means of a first alignment system and a second alignment system. For this reason, it is possible to increase the accuracy of the display element manufacturing apparatus, and elements with few defects can be mass manufactured.

What is claimed is:

1. A manufacturing apparatus for forming a conductive electrode or bus line on a flexible sheet substrate, the manufacturing apparatus comprising:

a transporting part, which transports the flexible sheet substrate in a prescribed transporting direction, wherein the flexible sheet substrate has a plurality of fiducial marks along the prescribed transporting direction;

a first alignment system, which images the fiducial marks and detects a position of the fiducial marks;

a second alignment system, which images the fiducial marks and detects a position of the fiducial marks, wherein the second alignment system is arranged at a prescribed distance from the first alignment system in the prescribed transporting direction;

an interferometer that measures a relative positional change between the first alignment system and the second alignment system in the prescribed transporting direction and acquires measurement values representative of the relative positional change;

a calculating part, which detects the fiducial marks and calculates an elongation or contraction of the flexible sheet substrate in the prescribed transporting direction based on the measurement values of the interferometer and the position of the fiducial marks by each of the first alignment system and the second alignment system; and a processing part, which forms the electrode or the bus line at a prescribed position of the flexible sheet substrate based on the calculated elongation or contraction of the substrate and the position of the fiducial marks.

2. The manufacturing apparatus according to claim 1, wherein:

the transporting part includes a transport roller; and the first alignment system and the second alignment system detect the fiducial marks on the flexible sheet substrate of supported on the transport roller.

3. The manufacturing apparatus according to claim 1, wherein the first alignment system and the second alignment system are joined by a holding part made of a material having a low thermal expansion coefficient.

4. The manufacturing apparatus according to claim 1, wherein:

the fiducial marks are formed at both ends of the flexible sheet substrate, which intersects the prescribed transporting direction, and the calculating part calculates the elongation or contraction of the flexible sheet substrate in a direction that intersects the prescribed transporting direction.

5. The manufacturing apparatus according to claim 1, comprising a mark forming part, which forms the fiducial marks on the flexible sheet substrate.

* * * * *